United States Patent
Uo et al.

(10) Patent No.: US 11,258,481 B2
(45) Date of Patent: Feb. 22, 2022

(54) MAGNETIC COUPLING DEVICE AND COMMUNICATION SYSTEM

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toyoaki Uo, Yokohama (JP); Tsuneo Suzuki, Kamakura (JP); Hiroaki Ishihara, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/023,767

(22) Filed: Sep. 17, 2020

(65) Prior Publication Data

US 2021/0006298 A1 Jan. 7, 2021

Related U.S. Application Data

(63) Continuation of application No. 16/288,358, filed on Feb. 28, 2019, now Pat. No. 10,917,139.

(30) Foreign Application Priority Data

Sep. 7, 2018 (JP) .............................. JP2018-168275

(51) Int. Cl.
*H04B 5/00* (2006.01)
*H01F 27/28* (2006.01)
*H03H 7/00* (2006.01)

(52) U.S. Cl.
CPC ............. *H04B 5/0087* (2013.01); *H03H 7/00* (2013.01)

(58) Field of Classification Search
CPC ......... H04B 5/00; H04B 5/0087; H01F 27/28; H03H 7/00
See application file for complete search history.

(56) References Cited

U.S. PATENT DOCUMENTS 5,214,392 A 5/1993 Kobayashi et al.
7,183,872 B2 2/2007 Lee
(Continued)

FOREIGN PATENT DOCUMENTS

CN 1753244 A 3/2006
CN 102484497 A 5/2012
(Continued)

OTHER PUBLICATIONS

Gingerich, K., et al. "The ISO72x Family of High-Speed Digital Isolators", Texas Instruments Application Report, SLLA198, 2006, 12 pages.

*Primary Examiner* — Dean O Takaoka
(74) *Attorney, Agent, or Firm* — Oblon, McClelland, Maier & Neustadt, L.L.P.

(57) ABSTRACT

According to one embodiment, there is provided a magnetic coupling device including a first coil, a second coil, a third coil, a fourth coil, a first constant-potential node and a second constant-potential node. The second coil is electrically connected with one end of the first coil and wound in a direction opposite to a direction in which the first coil is wound. The third coil faces the first coil. The fourth coil faces the second coil. The first constant-potential node is electrically connected with one end of the third coil. The second constant-potential node is electrically connected with one end of the fourth coil.

20 Claims, 11 Drawing Sheets

(56) References Cited

U.S. PATENT DOCUMENTS

| | | |
|---|---|---|
| 7,215,218 B2 | 5/2007 | Burns |
| 7,376,212 B2 | 5/2008 | Dupuis |
| 7,421,028 B2 | 9/2008 | Dupuis |
| 7,449,974 B2 | 11/2008 | Lee |
| 7,545,059 B2 | 6/2009 | Chen et al. |
| 7,656,262 B2 | 2/2010 | Muto |
| 7,733,082 B2 | 6/2010 | Abou |
| 7,899,409 B2 | 3/2011 | Huang |
| 7,983,059 B2 | 7/2011 | Chen |
| 8,228,133 B2 | 7/2012 | Motoyama |
| 8,428,539 B2 | 4/2013 | Dupuis |
| 8,547,186 B2 | 10/2013 | Kirkeby |
| 8,693,528 B1 | 4/2014 | Shrestha et al. |
| 8,710,964 B2 * | 4/2014 | Kaeriyama .......... H04B 5/0012 340/286.01 |
| 9,899,146 B2 | 2/2018 | Sugahara |
| 9,978,511 B2 | 5/2018 | Spina et al. |
| 10,917,139 B2 * | 2/2021 | Uo ................. H04B 5/0087 |
| 2003/0042571 A1 | 3/2003 | Chen |
| 2005/0088252 A1 | 4/2005 | Burns et al. |
| 2005/0271148 A1 | 12/2005 | Dupuis |
| 2006/0061429 A1 | 3/2006 | Lee et al. |
| 2007/0063786 A1 | 3/2007 | Shih |
| 2007/0205748 A1 | 9/2007 | Abou |
| 2008/0030080 A1 * | 2/2008 | Chen ................. H01L 23/60 307/91 |
| 2012/0139814 A1 | 6/2012 | Ishizuka et al. |
| 2014/0085951 A1 | 3/2014 | Kaeriyama |
| 2014/0354357 A1 | 12/2014 | Shrestha |
| 2014/0354371 A1 * | 12/2014 | Tsai ................. H01F 19/04 333/131 |
| 2017/0310236 A1 * | 10/2017 | Kaeriyama ......... H04L 25/4902 |

FOREIGN PATENT DOCUMENTS

| | | |
|---|---|---|
| JP | 2-128409 | 5/1990 |
| JP | 2007-234896 A | 9/2007 |
| JP | 4674590 | 4/2011 |
| JP | 2016-111374 | 6/2016 |

* cited by examiner

MAGNETIC COUPLING DEVICE AND COMMUNICATION SYSTEM

CROSS-REFERENCE TO RELATED APPLICATIONS

This application is a continuation of U.S. application Ser. No. 16/288,358 filed Feb. 28, 2019, which is based upon and claims the benefit of priority from Japanese Patent Application No. 2018-168275, filed on Sep. 7, 2018; the entire contents of each of which are incorporated herein by reference.

FIELD

Embodiments described herein relate generally to a magnetic coupling device and a communication system.

BACKGROUND

A magnetic coupling device provided between a transmission circuit and a reception circuit magnetically couples the transmission circuit and the reception circuit while electrically insulating the circuits from each other. In this case, it is desired to appropriately perform signal transmission from the transmission circuit to the reception circuit through the magnetic coupling device.

DETAILED DESCRIPTION

Figure 1:
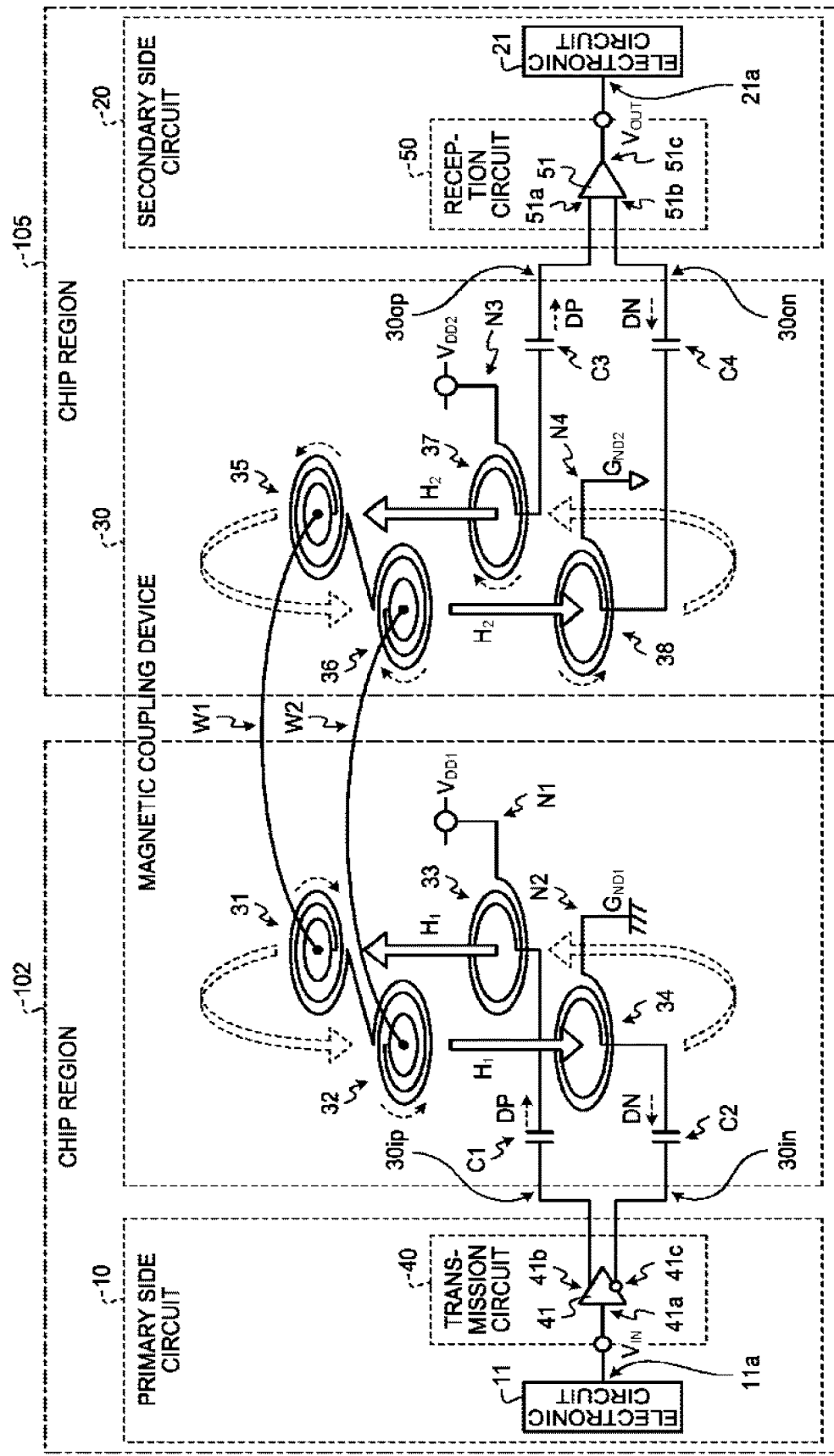
FIG. 1 is a diagram illustrating a circuit configuration and a signal transmitting operation of a communication system including a magnetic coupling device according to an embodiment.

In general, according to one embodiment, there is provided a magnetic coupling device including a first coil, a second coil, a third coil, a fourth coil, a first constant-potential node and a second constant-potential node. The second coil is electrically connected with one end of the first coil and wound in a direction opposite to a direction in which the first coil is wound. The third coil faces the first coil. The fourth coil faces the second coil. The first constant-potential node is electrically connected with one end of the third coil. The second constant-potential node is electrically connected with one end of the fourth coil.

Exemplary embodiments of a magnetic coupling device will be explained below in detail with reference to the accompanying drawings. The present invention is not limited to the following embodiments.

Embodiment

The following describes a magnetic coupling device according to an embodiment. The magnetic coupling device is used to perform signal transmission while electrically insulating a primary side circuit and a secondary side circuit from each other, for example, when operation voltage is largely different between the primary side circuit and the secondary side circuit. In a communication system including the magnetic coupling device, the primary side circuit includes a transmission circuit, and the secondary side circuit includes a reception circuit. The magnetic coupling device is disposed between the transmission circuit and the reception circuit so that a coil corresponding to the transmission circuit and a coil corresponding to the reception circuit can be electrically insulated from each other and magnetically coupled with each other. In this case, the magnetic coupling device is desired to appropriately transmit the signal from the coil on the transmitting side (primary side) to the coil on the receiving side (secondary side) while maintaining the insulation between the transmission circuit and the reception circuit. The magnetic coupling device is also desired to be applicable to a system in which the voltage difference between power voltages connected with the transmission circuit and the reception circuit is large and the operation speed of an element (for example, SiC or GaN) of an electronic circuit as a load is fast.

In the magnetic coupling device, the coils magnetically coupled with each other can be electrically insulated from each other by an insulating film. The magnetic coupling device may employ a double insulation configuration so that the magnetic coupling device can be mounted on an on-board instrument and/or an industrial instrument for which high reliability is requested. The double insulation configuration can easily secure sufficient dielectric voltage between the primary side coil and the secondary side coil, thereby satisfying the high-reliability request. In addition, the configuration guarantees secure operation of the function of an on-board instrument or an industrial instrument on which increasingly higher voltage is applied. However, a single insulation configuration may be employed when the reliability of the dielectric voltage is not so much requested in usage such as communication. In the single insulation configuration, a pair of coils on the primary or secondary side may be removed, and the remaining pair of coils may be directly connected with the transmission circuit or the reception circuit. Effects as described later are provided for the circuit connected with the pair of coils.

However, in the magnetic coupling device, the primary side coil and the secondary side coil are electrically insulated from each other, and a signal to be transmitted is a high-frequency signal. Thus, in the magnetic coupling device, electromagnetic interference (EMI) noise is potentially emitted to the outside when a high-frequency signal is transmitted between the primary side coil and the secondary side coil. It is desired to not only transmit a signal from the primary side coil to the secondary side coil but also reduce the EMI noise.

Since the magnetic coupling device includes the primary side coil, the secondary side coil, and resulting parasitic capacitances, noise current flows to the primary side through a parasitic capacitance, for example, when in-phase noise is generated on the secondary side, and then the primary side is potentially affected by common mode transient immunity (CMTI) noise. The CMTI is a specification required for the magnetic coupling device, and indicates that no false operation occurs when a stepped waveform with an abrupt gradient or the like is input to the primary side and the secondary side with the magnetic coupling device in operation. Reduction of the CMTI noise is desired to appropriately transmit only a signal from the primary side coil to the secondary side coil. The CMTI noise is desired to be further reduced as compared with a case in which the CMTI noise is reduced mainly through a single path.

Thus, in the embodiment, the magnetic coupling device has a double insulation configuration including two sets of an 8-shaped or meander-shaped coil and two coils facing the 8-shaped or meander-shaped coil, each of the two coils being connected with a constant-potential node. This configuration provides safe operation of the function of the magnetic coupling device, reduction of the EMI noise and the CMTI noise, and a high noise-resistance amount with a minimum number of components.

Specifically, a communication system 1 including a magnetic coupling device 30 may have a configuration as illustrated in FIG. 1. FIG. 1 is a diagram illustrating the configuration of the communication system 1 including the magnetic coupling device 30.

The magnetic coupling device 30 has a differential configuration. The magnetic coupling device 30 converts a pair of differential signals transferred from a primary side circuit 10 into magnetic field energy, converts the magnetic field energy into a pair of differential signals again, and transfers the converted differential signals to a secondary side circuit 20.

The primary side circuit 10 includes an electronic circuit 11 and a transmission circuit 40. The secondary side circuit 20 includes a reception circuit 50 and an electronic circuit 21. The transmission circuit 40 and the reception circuit 50 may each have a differential configuration.

The transmission circuit 40 is disposed between the electronic circuit 11 and the magnetic coupling device 30. The transmission circuit 40 includes a differential driver circuit 41. The differential driver circuit 41 is a differential amplifier of a single-phase input and differential output type, and has an input terminal 41a electrically connected with an output node 11a of the electronic circuit 11, a non-inverting output terminal 41b electrically connected with a P-side input node 30ip of the magnetic coupling device 30, and an inverting output terminal 41c electrically connected with an N-side input node 30in of the magnetic coupling device 30.

The electronic circuit 11 may have a differential configuration. In this case, the differential driver circuit 41 may be a differential amplifier of a differential input and differential output type. The differential driver circuit 41 has a non-inverting input terminal electrically connected with a non-inverting output node of the electronic circuit 11, and an inverting input terminal electrically connected with an inverting output node of the electronic circuit 11.

The reception circuit 50 is disposed between the magnetic coupling device 30 and the electronic circuit 21. The reception circuit 50 includes a differential receiver circuit 51. The differential receiver circuit 51 is a differential amplifier of a differential input and single-phase output type, and has a non-inverting input terminal 51a electrically connected with a P-side output node 30op of the magnetic coupling device 30, an inverting input terminal 51b electrically connected with an N-side output node 30on of the magnetic coupling device 30, and an output terminal 51c electrically connected with an input node 21a of the electronic circuit 21.

The electronic circuit 21 may have a differential configuration. In this case, the differential receiver circuit 51 may be a differential amplifier of a differential input and differential output type. The differential receiver circuit 51 may have a non-inverting output terminal electrically connected with a P-side input node of the electronic circuit 21, and an inverting output terminal electrically connected with an N-side input node of the electronic circuit 21.

The magnetic coupling device 30 may have a double insulation configuration. The magnetic coupling device 30 includes a coil (first coil) 31, a coil (second coil) 32, a coil (third coil) 33, a coil (fourth coil) 34, a coil (fifth coil) 35, a coil (sixth coil) 36, a coil (seventh coil) 37, a coil (eighth coil) 38, a capacitor element (first capacitor element) C1, a capacitor element (second capacitor element) C2, a capacitor element (third capacitor element) C3, a capacitor element (fourth capacitor element) C4, a node (first constant-potential node) N1, a node (second constant-potential node) N2, a node (third constant-potential node) N3, a node (fourth constant-potential node) N4, a bonding wire W1, and a bonding wire W2.

Figure 2:
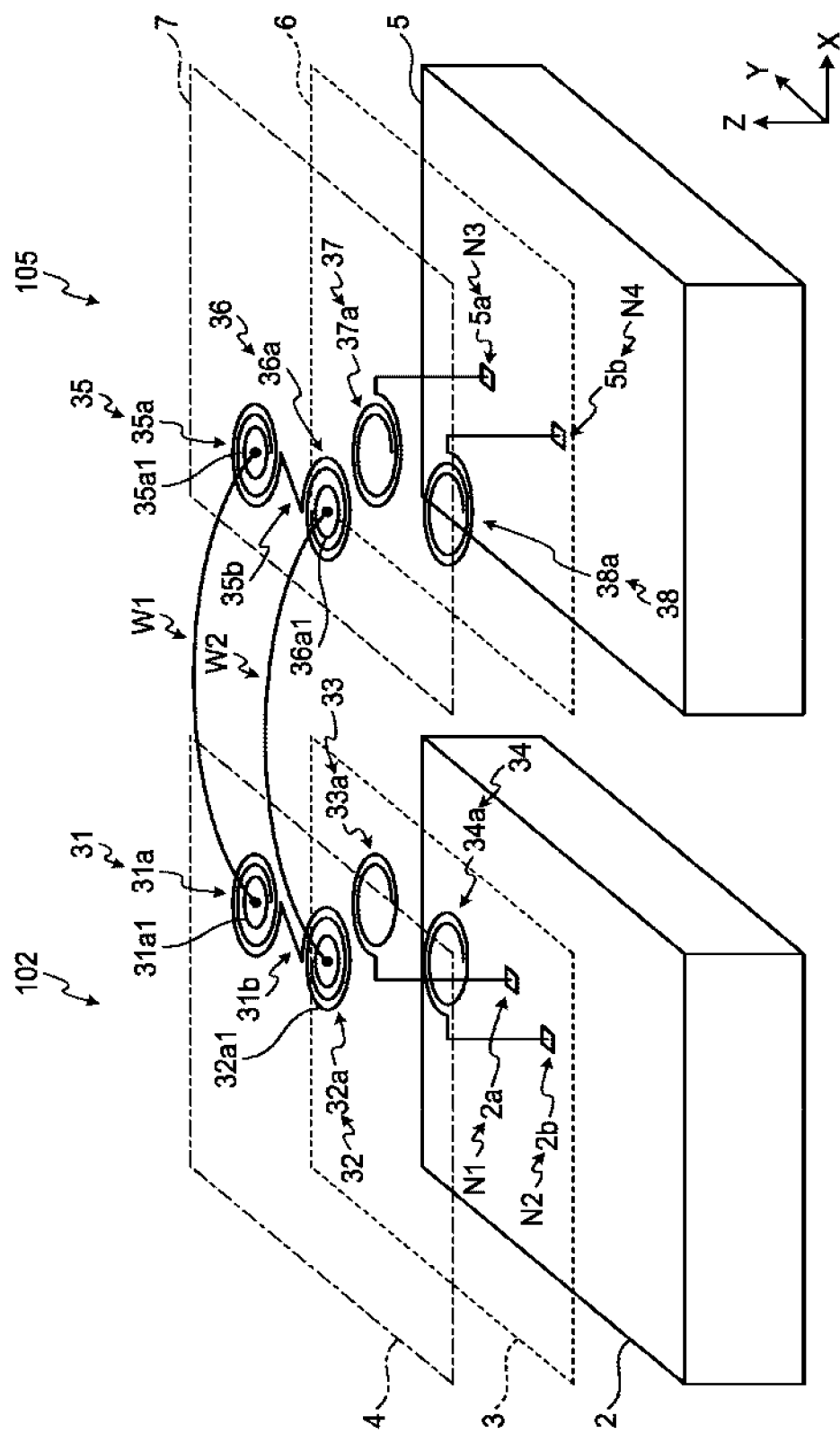
FIG. 2 is a diagram illustrating an implemented configuration of the magnetic coupling device according to the embodiment.

The primary side circuit 10 and some components (namely, the coil 31, the coil 32, the coil 33, the coil 34, the capacitor element C1, the capacitor element C2, the node N1, and the node N2) of the magnetic coupling device 30 are included in a chip region 102 corresponding to a substrate 2 (refer to FIG. 2). The secondary side circuit 20 and the other components (namely, the coil 35, the coil 36, the coil 37, the coil 38, the capacitor element C3, the capacitor element C4, the node N3, and the node N4) of the magnetic coupling device 30 are included in a chip region 105 corresponding to a substrate 5 (refer to FIG. 2).

The coil 31 and the coil 32 form an 8-shaped or meander-shaped coil. The coil 31 has one end electrically connected with the coil 32, and the other end electrically connected with the coil 35 through the bonding wire W1. The coil 32 has one end electrically connected with the coil 31, and the other end electrically connected with the coil 36 through the bonding wire W2. The coil 31 and the coil 32 are wound in directions opposite to each other.

The coil 33 is disposed below the coil 31, facing the coil 31 through an insulating film (refer to FIG. 2). With this configuration, the coils 31 and 33 are electrically insulated from each other and magnetically coupled to form a transformer. The coil 33 has one end electrically connected with the node N1, and the other end electrically connected with one end of the capacitor element C1. The node N1 is electrically connected with a constant potential, for example, a power potential VDD1. The power potential VDD1 may be a potential supplied from the outside of the chip region 102.

The capacitor element C1 has one end electrically connected with the coil 33, and the other end electrically connected with the non-inverting output terminal 41b of the differential driver circuit 41. The capacitor element C1 functions as a coupling capacitor configured to transfer a P-side signal in a differential signal output from the differential driver circuit 41 to the coil 33 side (after converting the signal into voltage, electric field, and then current), thereby generating current indicated by a dashed-line arrow.

The coil 34 is disposed below the coil 32, facing the coil 32 through an insulating film (refer to FIG. 2). With this configuration, the coils 32 and 34 are electrically insulated from each other and magnetically coupled to form a transformer. The coil 34 has one end electrically connected with the node N2, and the other end electrically connected with one end of the capacitor element C2. The node N2 is electrically connected with a constant potential, for example, a ground potential GND1. The ground potential GND1 may be a potential supplied from the outside of the chip region 102. The coil 33 and the coil 34 are separated from each other, and the nodes N and N2 are separated from each other and may have a plurality of connection points.

The capacitor element C2 has one end electrically connected with the coil 34 and, the other end electrically connected with the inverting output terminal 41c of the differential driver circuit 41. The capacitor element C2 functions as a coupling capacitor configured to transfer an N-side signal in a differential signal output from the differential driver circuit 41 to the coil 34 side (after converting the signal into voltage, electric field, and then current), thereby generating current indicated by a dashed-line arrow.

Similarly, the coils 35 and 36 form an 8-shaped or meander-shaped coil. The coil 35 has one end electrically connected with the coil 36, and the other end electrically connected with the coil 31 through the bonding wire W1. The coil 36 has one end electrically connected with the coil 35, and the other end electrically connected with the coil 32 through the bonding wire W2. The coil 35 and the coil 36 are wound in directions opposite to each other.

The coil 37 is disposed below the coil 35, facing the coil 35 through an insulating film (refer to FIG. 2). With this configuration, the coils 35 and 37 are electrically insulated from each other and magnetically coupled to form a transformer. The coil 37 has one end electrically connected with the node N3, and the other end electrically connected with one end of the capacitor element C3. The node N3 is electrically connected with a constant potential, for example, a power potential VDD2. The power potential VDD2 may be a potential supplied from the outside of the chip region 105.

The capacitor element C3 has one end electrically connected with the coil 37, and the other end electrically connected with the non-inverting input terminal 51a of the differential receiver circuit 51. The capacitor element C3 functions as a coupling capacitor configured to transfer a P-side signal in a differential signal output from the coil 37 to the differential receiver circuit 51 side (after converting into voltage, electric field, and then voltage), thereby generating current indicated by a dashed-line arrow.

The coil 38 is disposed below the coil 36, facing the coil 36 through an insulating film (refer to FIG. 2). With this configuration, the coils 36 and 38 are electrically insulated from each other and magnetically coupled to form a transformer. The coil 38 has one end electrically connected with the node N4, and the other end electrically connected with one end of the capacitor element C4. The node N4 is electrically connected with a constant potential, for example, a ground potential GND2. The ground potential GND2 may be a potential supplied from the outside of the chip region 105. The coil 37 and the coil 38 are separated from each other, and the nodes N3 and N4 are separated from each other and may have a plurality of connection points.

The capacitor element C4 is disposed between the coil 38 and the reception circuit 50. The capacitor element C4 has one end electrically connected with the coil 38, and the other end electrically connected with the inverting input terminal 51b of the differential receiver circuit 51. The capacitor element C4 functions as a coupling capacitor configured to transfer an N-side signal in a differential signal output from the coil 38 to the differential receiver circuit 51 side (after converting into voltage, electric field, and then voltage), thereby generating current indicated by a dashed-line arrow.

The double insulation configuration of the magnetic coupling device 30 may be implemented, for example, as illustrated in FIG. 2. FIG. 2 is a diagram illustrating an implemented configuration of the magnetic coupling device 30. In FIG. 2, a Z direction is defined to be a direction perpendicular to the surface of the substrate 2, and an X direction and a Y direction are defined to be two directions orthogonal to each other in a plane perpendicular to the Z direction.

For example, the coil 33 may be formed as a coil pattern 33a included in a wiring layer 3. The wiring layer 3 is disposed in the +Z direction relative to the substrate 2 and extends in the X and Y directions. The coil pattern 33a extends along a plane corresponding to the wiring layer 3. The node N1 electrically connected with the coil 33 is disposed as an electrode pad 2a on the substrate 2. The coil 34 may be formed as a coil pattern 34a included in the wiring layer 3. The coil pattern 34a extends along a plane corresponding to the wiring layer 3. The node N2 electrically connected with the coil 34 is disposed as an electrode pad 2b on the substrate 2. The coil 31 is disposed at a position facing the coil 33, and may be formed as a coil pattern 31a included in a wiring layer 4. The wiring layer 4 is disposed in the +Z direction relative to the wiring layer 3, and extends in the X and Y directions. The coil pattern 31a extends along a plane corresponding to the wiring layer 4. The coil 32 is disposed at a position facing the coil 34, and may be formed as a coil pattern 32a included in the wiring layer 4. The coil pattern 32a extends along a plane corresponding to the wiring layer 4. A line pattern 31b extends between the coil pattern 31a and the coil pattern 32a in the wiring layer 4, and electrically connects the coil pattern 31a and the coil pattern 32a.

Similarly, the coil 37 may be formed as a coil pattern 37a included in a wiring layer 6. The wiring layer 6 is disposed in the +Z direction relative to the substrate 5 and extends in the X and Y directions. The coil pattern 37a extends along a plane corresponding to the wiring layer 6. The node N3 electrically connected with the coil 37 is disposed as an electrode pad 5a on the substrate 5. The coil 38 may be formed as a coil pattern 38a included in the wiring layer 6. The coil pattern 38a extends along a plane corresponding to the wiring layer 6. The node N4 electrically connected with the coil 38 is disposed as an electrode pad 5b on the substrate 5. The coil 35 is disposed at a position facing the coil 37 and may be formed as a coil pattern 35a included in a wiring layer 7. The wiring layer 7 is disposed in the +Z direction relative to the wiring layer 6 and extends in the X and Y directions. The coil pattern 35a extends along a plane corresponding to the wiring layer 7. The coil 36 is disposed at a position facing the coil 38 and may be formed as a coil pattern 36a included in the wiring layer 7. The coil pattern 36a extends along a plane corresponding to the wiring layer 7. A line pattern 35b extends between the coil pattern 35a and the coil pattern 36a in the wiring layer 7, and electrically connects the coil pattern 35a and the coil pattern 36a.

In FIG. 2, a region including the substrate 2, the wiring layer 3, and the wiring layer 4 corresponds to the chip region 102, and a region including the substrate 5, the wiring layer 6, and the wiring layer 7 corresponds to the chip region 105. The bonding wires W1 and W2 are disposed across the chip region 102 and the chip region 105. The bonding wire W1 has one end connected with electrode 31a1 in the coil pattern 31a, and the other end connected with an electrode 35a1 in the coil pattern 35a. The bonding wire W2 has one end connected with an electrode 32a1 in the coil pattern 32a, and the other end connected with an electrode 36a1 in the coil pattern 36a. The bonding wires W1 and W2 may be formed of material containing metal (for example, Au) as a primary component. The bonding wires W1 and W2 have diameters of 30 □m approximately, for example.

With the double insulation configuration, the magnetic coupling device 30 can easily secure sufficient dielectric voltage between the coils 33 and 37, and sufficient dielectric voltage between the coils 34 and 38. For example, the dielectric voltage between the coils 33 and 31 can be secured by providing an insulating film between the wiring layer 3 and the wiring layer 4 in the Z direction, and the dielectric voltage between the coils 35 and 37 can be secured by providing an insulating film between the wiring layer 7 and the wiring layer 6 in the Z direction. Each insulating film may be formed of material containing oxide (for example, silicon oxide) as a primary component, or may be formed of material containing insulating resin (for example, polyimide) as a primary component.

Similarly, sufficient dielectric voltage between the coils 34 and 32 can be secured by providing an insulating film between the wiring layer 3 and the wiring layer 4 in the Z direction, and sufficient dielectric voltage between the coils 36 and 38 can be secured by providing an insulating film between the wiring layer 7 and the wiring layer 6 in the Z direction. Each insulating film may be formed of material containing oxide (for example, silicon oxide) as a primary component, or may be formed of material containing insulating resin (for example, polyimide) as a primary component.

The following describes a signal transmitting operation with reference to FIG. 1. A transformer (for example, the pair of coils 31 and 33, the pair of coils 32 and 34, the pair of coils 35 and 37, or the pair of coils 36 and 38) cannot transmit a DC signal (signal having no frequency component in effect) but transmits a modulated signal (signal having a frequency component). In FIG. 1, a signal $V_{IN}$ input from the electronic circuit 11 to the differential driver circuit 41 is a modulated signal, for example, a signal modulated by an edge trigger scheme or an on-off keying scheme. The format of the signal transmission may be in an FSK scheme as well as an ASK scheme. ASK stands for amplitude shift keying and represents amplitude shift modulation. The ASK scheme is a modulation scheme in which digital signal information is represented by the amplitude of carrier wave. In a kind of the ASK scheme, referred to as on-off keying (OOK), the ASK modulation ratio is infinite, and digital signal information is represented by the existence of the amplitude. FSK stands for frequency shift keying and represents frequency shift modulation. The FSK scheme is a modulation scheme in which digital signal information is represented by the frequency of carrier wave.

The signal $V_{IN}$ is a signal (signal having a frequency component) obtained by shifting the original signal to a high frequency band. The differential driver circuit 41 generates differential signals (a P-side signal DP and an N-side signal DN) in accordance with the input signal $V_{IN}$, and transfers the signal DP to the coil 33 side through the capacitor element C1, and the signal DN to the coil 34 side through the capacitor element C2. Accordingly, as indicated by a dashed-line arrow, the differential driver circuit 41 applies currents in directions opposite to each other to the coils 33 and 34. The coil 33 and the coil 34, which are wound in the same direction, generate magnetic fields ($H_1$) in directions opposite to each other as illustrated with a solid-line white arrow. When the coils 33 and 34 have substantially identical shapes (for example, have substantially equal diameters and are wound substantially equal numbers of times), the magnitudes of the generated magnetic fields are substantially equal to each other. However, since the coils 31 and 32 are wound in directions opposite to each other, induced voltages thereof due to $H_1$ are summed.

In this case, in a signal transmitting operation in a configuration including the pair of coils 31 and 33 and the pair of coils 32 and 34, a magnetic flux loop illustrated with solid-line white arrows and dashed-line white arrows can be formed, thereby easily reducing externally emitted magnetic field and thus reducing the EMI noise.

The coils 31 and 35 are connected with each other through the bonding wire W1, and the coils 32 and 36 are connected with each other through the bonding wire W2. Accordingly, the sum of induced voltages generated by the coils 31 and 32 is applied to the coils 35 and 36. The coils 35 and 36, which are wound in directions opposite to each other, generate magnetic fields ($H_2$) in directions opposite to each other as illustrated with solid-line white arrows. When the coils 35 and 36 have substantially identical shapes (for example, have substantially equal diameters and are wound substantially equal numbers of times), the magnitudes of the generated magnetic fields are substantially equal to each other. However, the coils 37 and 38 are wound in directions identical to each other. Since the magnetic fields ($H_2$) having directions opposite to each other and magnitudes substantially equal to each other are applied to the coils 37 and the coil 38, induced voltages having magnitudes substantially equal to each other and directions opposite to each other are generated at the coils. Accordingly, induced currents indicated by dashed-line arrows flow as the signals DP and DN through the coils 37 and the coil 38, respectively. The signal DP is transferred to the differential receiver circuit 51 side through the capacitor element C3, and the signal DN is transferred to the differential receiver circuit 51 side through the capacitor element C4. Accordingly, the differential receiver circuit 51 receives the currents in directions opposite to each other as the signals DP and DN from the coils 37 and 38 as indicated by dashed-line arrows. The differential receiver circuit 51 generates a difference signal $V_{OUT}$ in accordance with the signals DP and DN and outputs the difference signal $V_{OUT}$ to the electronic circuit 21. In this manner, modulated signal transmission is performed.

In this case, in a signal transmitting operation in a configuration including the pair of coils 35 and 37 and the pair of coils 36 and 38, a magnetic flux loop illustrated with solid-line white arrows and dashed-line white arrows can be formed, thereby easily reducing externally emitted magnetic field and thus reducing the EMI noise.

Figure 3:
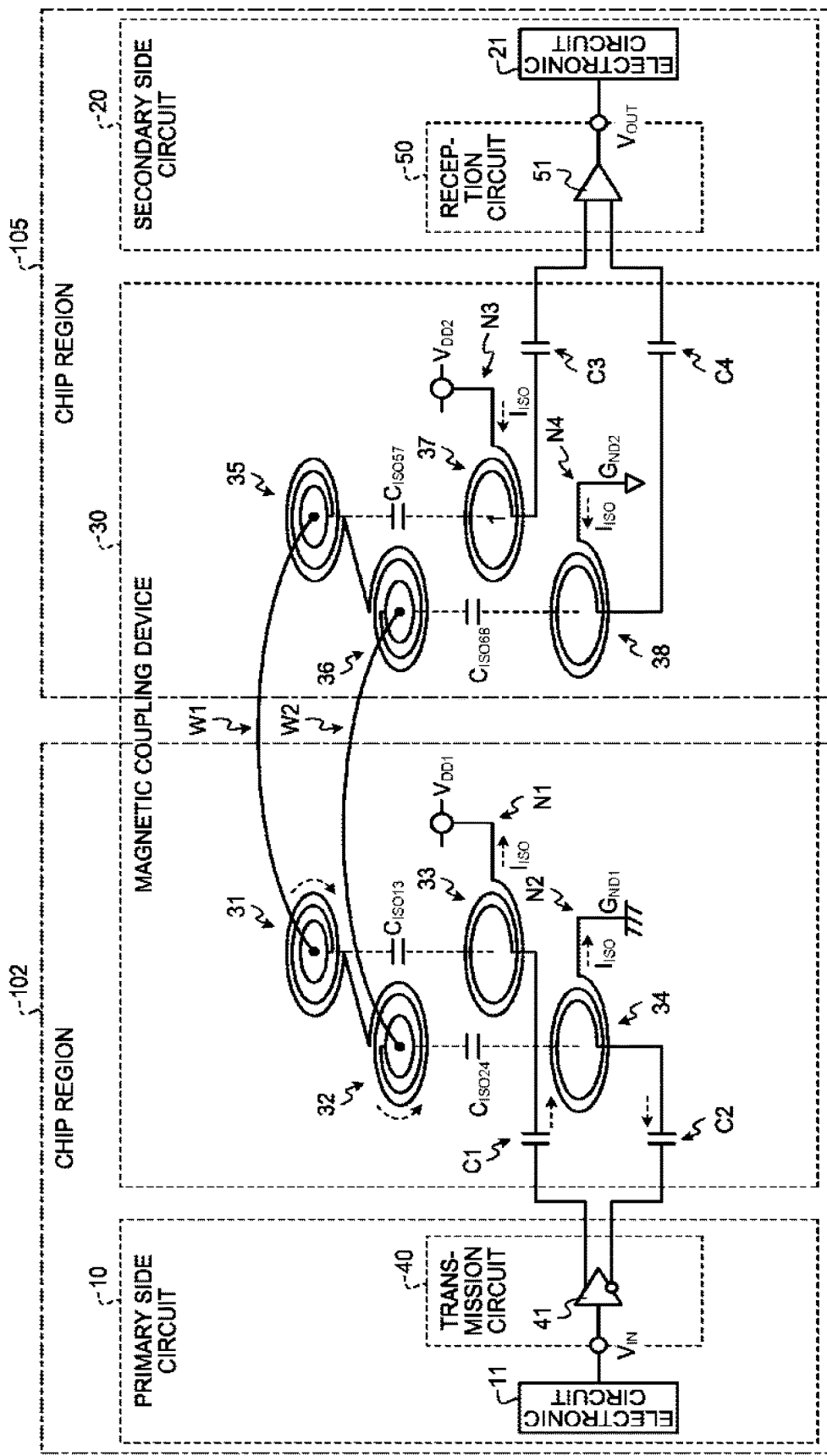
FIG. 3 is a diagram illustrating an operation for CMTI noise by the communication system including the magnetic coupling device according to the embodiment.

The following describes an operation for the CMTI noise with reference to FIG. 3. FIG. 3 is a diagram illustrating an operation for the CMTI noise by the communication system 1 including the magnetic coupling device 30. The magnetic coupling device 30 has a CMTI resistance amount as one of its properties. Specifically, the CMTI resistance amount indicates whether a false operation occurs in signal transmission when one of potentials changes with reference to the other potential. In a typical example of the CMTI resistance amount, it is desirable to have resistance up to the change amount of 100 kV/μs or more when a reference potential (for example, a power potential and/or a ground potential) changes by 1000 V between the chip region 102 corresponding to the substrate 2 and the chip region 105 corresponding to the substrate 5. FIG. 3 illustrates a case in which the reference potential of the chip region 105 changes with reference to the reference potential of the chip region 102 in the present embodiment. The pair of coils 33 and 31 and the pair of coils 34 and 32 face each other through an insulating film in the chip region 102. Similarly, the pair of coils 37 and 35 and the pair of coils 38 and 36 face each other through an insulating film in the chip region 105. Accordingly, parasitic capacitance $C_{ISO13}$, $C_{ISO24}$, $C_{ISO37}$, or $C_{ISO68}$ exists between the coils in each pair.

When the reference potential of the chip region 105 is changed with the reference potential of the chip region 102 unchanged, reference voltage change is divided between the parasitic capacitance $C_{ISO13}$ and the parasitic capacitance $C_{ISO37}$ and between the parasitic capacitance $C_{ISO24}$ and the parasitic capacitance $C_{ISO68}$. When the parasitic capacitance $C_{ISO13}$, the parasitic capacitance $C_{ISO37}$, the parasitic capacitance $C_{ISO24}$, and the parasitic capacitance $C_{ISO68}$ are substantially equivalent to each other, the reference potential of the chip region 102 and about half of the change of the reference potential of the chip region 105 are applied to both ends of each of the parasitic capacitance $C_{ISO13}$, the parasitic capacitance $C_{ISO37}$, the parasitic capacitance $C_{ISO24}$, and the parasitic capacitance $C_{ISO68}$. In this case, to electrically charge and discharge the parasitic capacitance $C_{ISO37}$, a P-side noise component (frequency component) flows to the power potential $V_{DD2}$, the node N3, and then the coil 37. When the parasitic capacitance $C_{ISO37}$ has an impedance smaller than that of the capacitor element C3, the P-side noise component is transferred to the coil 37, the parasitic capacitance $C_{ISO37}$, the coil 35, the bonding wire W1, the coil 31, the parasitic capacitance $C_{ISO13}$, and then to the coil 33. Furthermore, since the node N1 has an impedance smaller than that of the capacitor element C1, the P-side noise component flows to the coil 33, the node N1, and then to the power potential $V_{DD}$. Accordingly, the P-side noise component can be prevented from affecting the differential driver circuit 41 and the differential receiver circuit 51, which leads to reduction of the CMTI noise.

Similarly, an N-side noise component (frequency component) flows to the ground potential $G_{ND2}$, the node N4, and then the coil 38. When the parasitic capacitance $C_{ISO68}$ has an impedance smaller than that of the capacitor element C4, the N-side noise component is transferred to the coil 38, the parasitic capacitance $C_{ISO68}$, the coil 36, the bonding wire W2, the coil 32, the parasitic capacitance $C_{ISO24}$, and then to the coil 34. Furthermore, since the node N2 has an impedance smaller than that of the capacitor element C2, the N-side noise component is transferred to the coil 34, the node N2, and then to the ground potential $G_{ND1}$. Accordingly, the N-side noise component can be prevented from affecting the differential driver circuit 41 and the differential receiver circuit 51, which leads to reduction of the CMTI noise.

Since the P-side noise component and the N-side noise component are transferred to the reference potentials (the power potential $V_{DD}$ and the ground potential $G_{ND1}$) different from each other in the chip region 102, the occurrence of power voltage change due to the noise components can be prevented in the chip region 102, and a false circuit operation due to the CMTI noise can be prevented.

Figure 4:
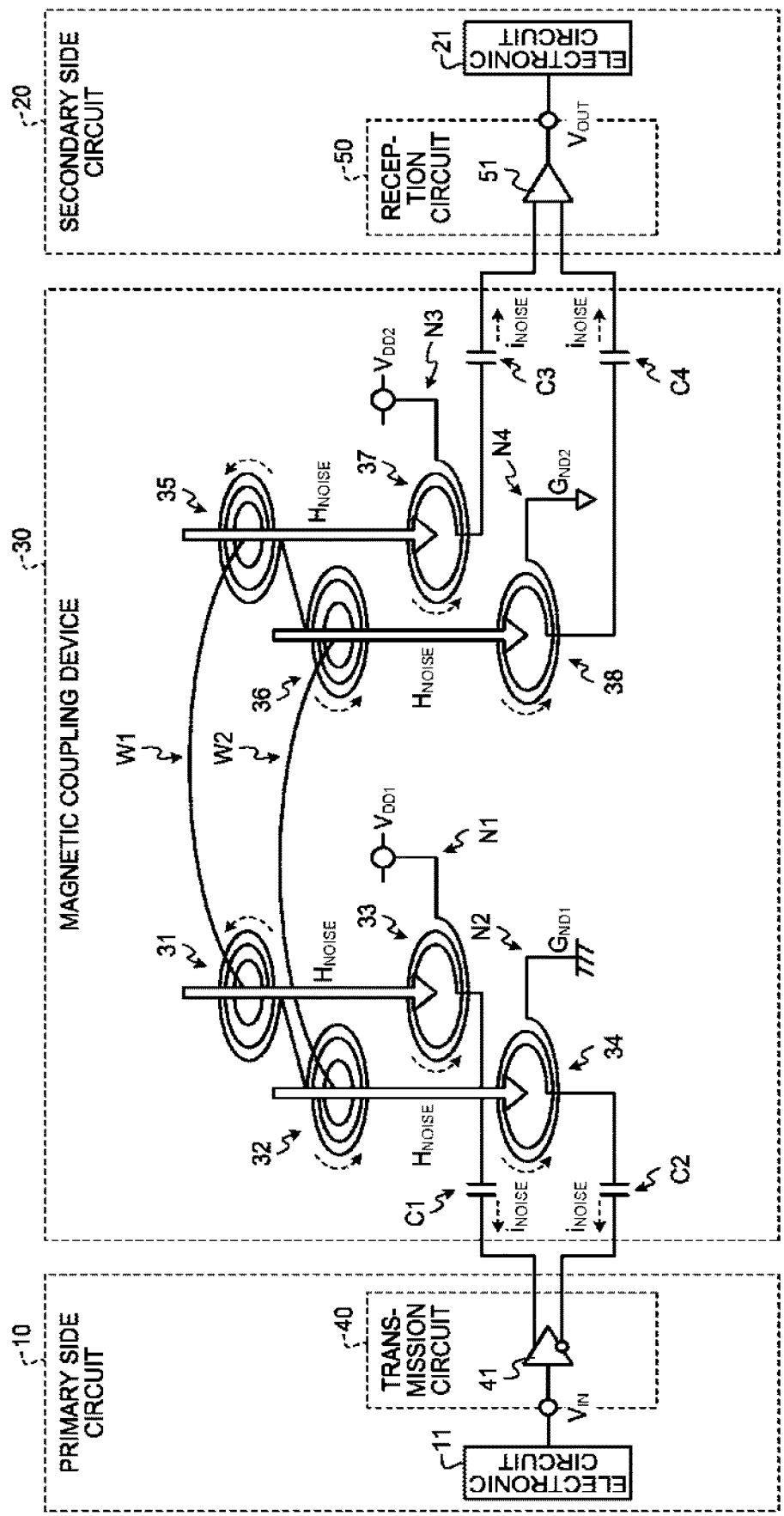
FIG. 4 is a diagram illustrating an operation for an external magnetic field by the communication system including the magnetic coupling device according to the embodiment.

The following describes an operation for an external magnetic field with reference to FIG. 4. FIG. 4 is a diagram illustrating an operation for an external magnetic field by the communication system 1 including the magnetic coupling device 30.

For example, an external magnetic field $H_{NOISE}$ is applied in a direction from the upper side to the lower side in the sheet of FIG. 4. When the external magnetic field $H_{NOISE}$ is generated from a source at a distance significantly larger than the scale of the coils, the external magnetic field $H_{NOISE}$ is applied on the coils 31 to 38 in an identical direction at magnitudes substantially equal to each other. Since the coils 31 and 32 have interlinkage magnetic flux areas identical to each other and are wound in directions opposite to each other, no induced voltage due to the external magnetic field $H_{NOISE}$ is generated in effect. Similarly, no induced voltage due to the external magnetic field $H_{NOISE}$ is generated in effect at the coils 35 and 36. However, in-phase induced voltages are generated at each of the pair of coils 33 and 34 and the pair of coils 37 and 38. As a result, the differential receiver circuit 51 suffers in-phase noises $I_{NOISE}$, but the in-phase noises can be canceled with each other to have no influence on a signal reception operation. In addition, influence on the in-phase induced voltages can be reduced by decreasing the output impedance of the differential driver circuit 41, which leads to minor influence on the differential driver circuit 41.

As described above, in the embodiment, the magnetic coupling device 30 has the double insulation configuration including two sets of an 8-shaped or meander-shaped coil (the pair of coils 31 and 32 or the pair of coils 35 and 36) and two coils (the pair of coils 33 and 34 or the pair of coils 37 and 38) facing the 8-shaped or meander-shaped coil. The two coils are connected with the respective nodes N1 and N2 or the respective nodes N3 and N4, each having a constant potential. With this configuration, the EMI noise can be reduced and the CMTI noise can be reduced. Accordingly, the magnetic coupling device 30 has a high CMTI and a high noise-resistance amount, and can transmit a modulated signal (differential signal) and excellently operate under an environment with a high external magnetic field, such as a system with a fast operation speed of an element (for example, SiC or GaN) of an electronic circuit as a load.

The nodes N1 and N2 may have potentials equal to each other, and the nodes N3 and N4 may have potentials equal to each other.

For example, in the chip region 102, the nodes N1 and N2 may be each electrically connected with the power potential $V_{DD}$. Alternatively, for example, the nodes N1 and N2 may be each electrically connected with the ground potential $G_{ND1}$. The size of a current loop on a path through which differential signal current flows can be reduced when the nodes N1 and N2 have potentials equal to each other as compared with a case in which the nodes N1 and N2 have potentials different from each other. Accordingly, an externally emitted magnetic field due to a differential signal current loop can be easily prevented in the chip region 102, which leads to reduction of the EMI noise.

Similarly, in the chip region 105, the nodes N3 and N4 may be each electrically connected with the power potential $V_{DD2}$. Alternatively, for example, the nodes N3 and N4 may be each electrically connected with the ground potential $G_{ND2}$. The size of a current loop on a path through which differential signal current flows can be reduced when the nodes N3 and N4 have potentials equal to each other as compared with a case in which the nodes N3 and N4 have potentials different from each other. Accordingly, an externally emitted magnetic field due to a differential signal current loop can be easily prevented in the chip region 105, which leads to reduction of the EMI noise.

Figure 5:
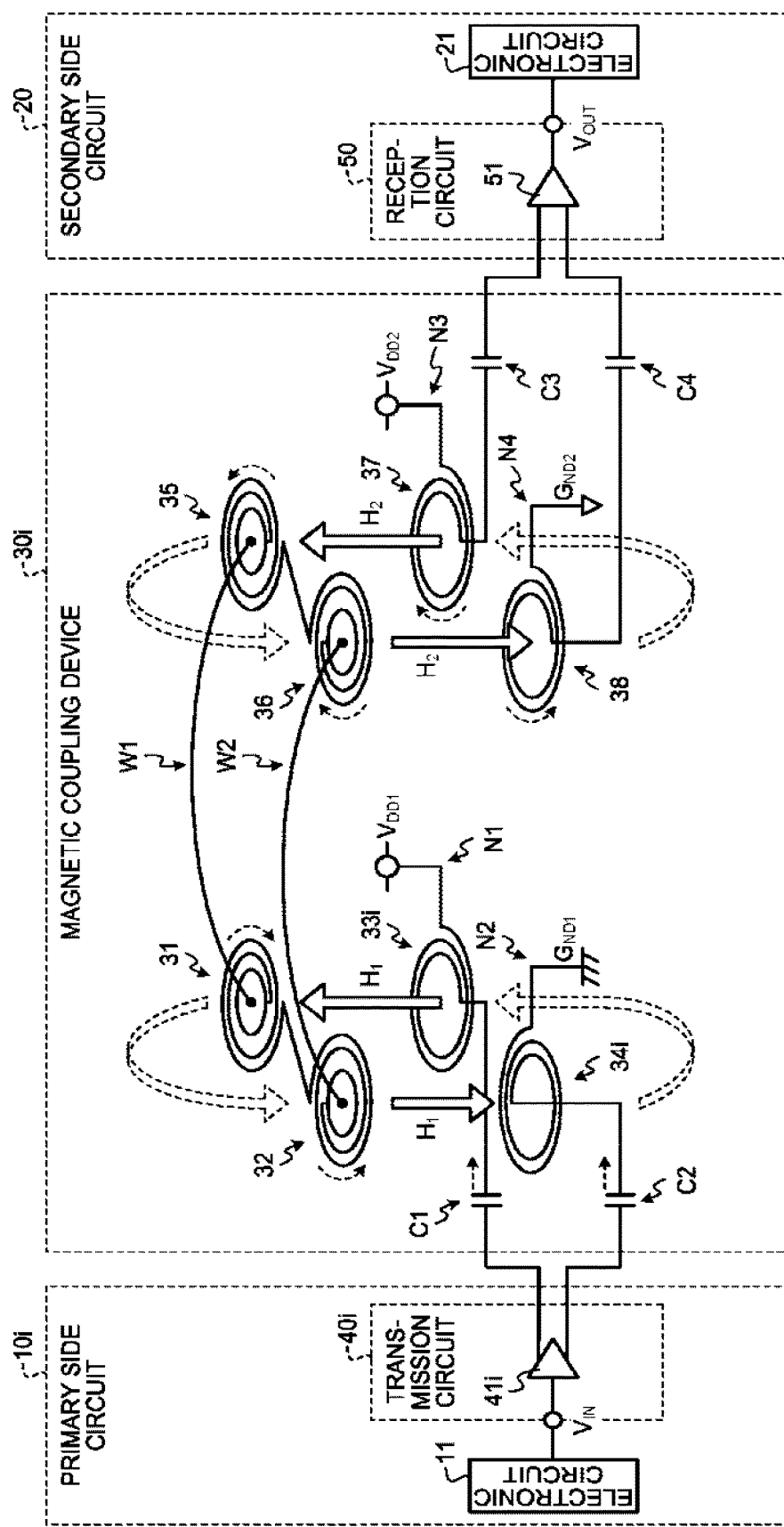
FIG. 5 is a diagram illustrating a circuit configuration and a signal transmitting operation of a communication system including a magnetic coupling device according to a first modification of the embodiment.

Alternatively, as a first modification of the embodiment, a communication system 1*i* may have a configuration as illustrated in FIG. 5. FIG. 5 is a diagram illustrating a circuit configuration and a signal transmitting operation of the communication system 1*i* including a magnetic coupling device 30*i* according to the first modification of the embodiment.

The communication system 1*i* illustrated in FIG. 5 includes a primary side circuit 10*i* and the magnetic coupling device 30*i* in place of the primary side circuit 10 and the magnetic coupling device 30 (refer to FIG. 1). The primary side circuit 10*i* includes a transmission circuit 40*i* in place of the transmission circuit 40 (refer to FIG. 1). The transmission circuit 40*i* includes an in-phase driver circuit 41*i* in place of the differential driver circuit 41 (refer to FIG. 1). The magnetic coupling device 30*i* includes a coil 33*i* and a coil 34*i* in place of the coil 33 and the coil 34 (refer to FIG. 1). The coils 33*i* and 34*i* are wound in directions opposite to each other.

The following describes the signal transmitting operation with reference to FIG. 5. The in-phase driver circuit 41*i* generates currents indicated by dashed-line arrows through the capacitor element C1 and the capacitor element C2 in accordance with the input signal $V_{IN}$, and passes the in-phase currents to the coils 33*i* and 34*i*. Since the coils 33*i* and 34*i* are wound in directions opposite to each other, the respective coils generate magnetic fields ($H_1$) in directions opposite to each other. Thereafter, the same signal transmitting operation as that in the embodiment can be performed.

The operation for the CMTI noise is the same as the operation in the embodiment illustrated in FIG. 3. Specifically, unlike the embodiment, the coils 33*i* and 34*i* are wound in directions opposite to each other, but the winding directions of the coils do not affect formation of the parasitic capacitances $C_{ISO13}$ and $C_{ISO24}$. Thus, according to the first modification of the embodiment, the CMTI noise can be reduced similarly to the embodiment.

Figure 6:
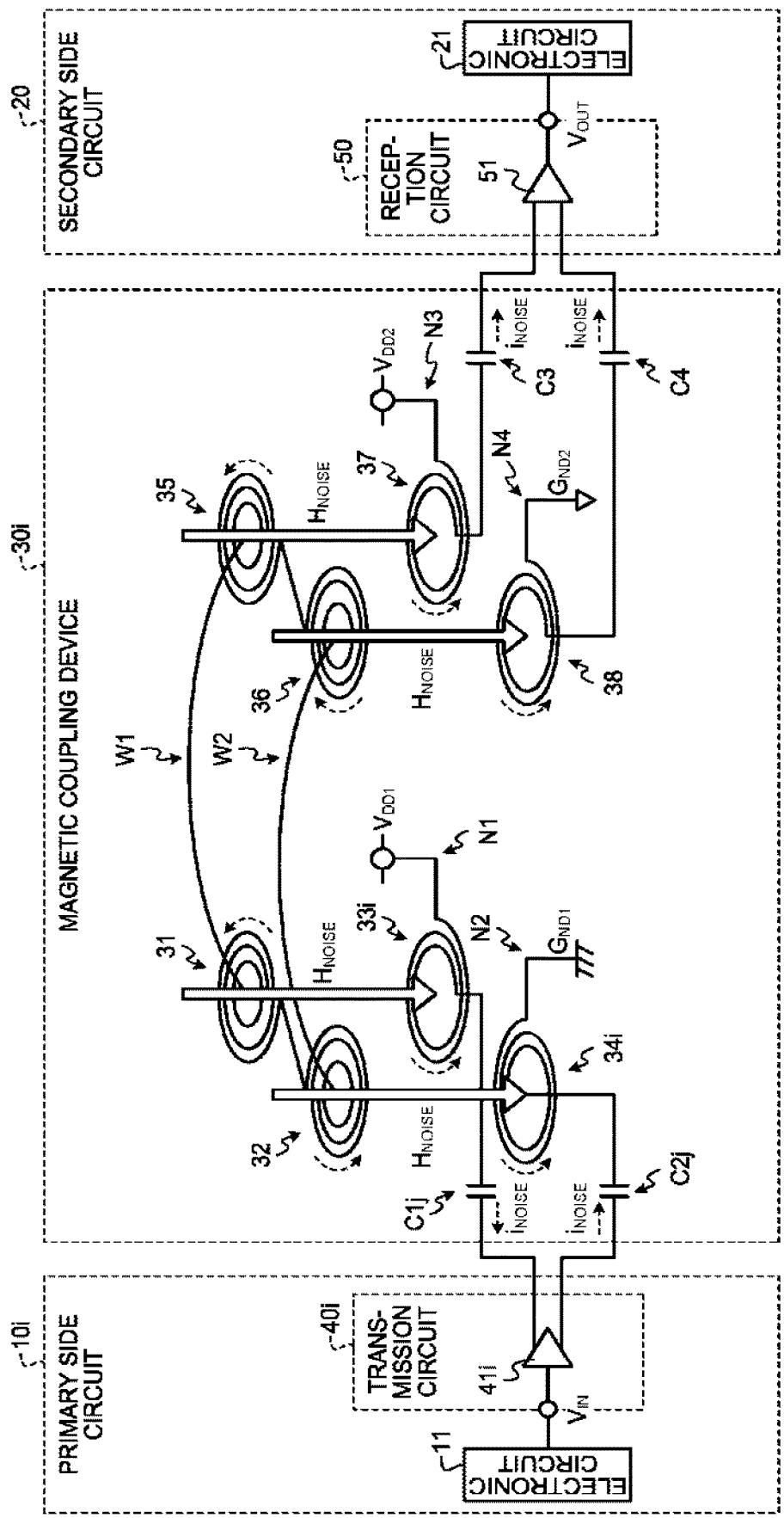
FIG. 6 is a diagram illustrating an operation for an external magnetic field by the communication system including the magnetic coupling device according to the first modification of the embodiment.

The operation for an external magnetic field is as illustrated in FIG. 6. FIG. 6 is a diagram illustrating the operation for an external magnetic field by the communication system 1*i* including the magnetic coupling device 30*i* according to the first modification of the embodiment. Specifically, since the coils 33*i* and 34*i* are wound in directions opposite to each other, differential noise currents $I_{NOISE}$ flow to the in-phase driver circuit 41*i* when the external magnetic field $H_{NOISE}$ is applied as illustrated in FIG. 6. Thus, influence on the in-phase induced voltages can be reduced by decreasing the output impedance of the in-phase driver circuit 41*i*.

In this manner, in the first modification of the embodiment, too, the EMI noise can be reduced and the CMTI noise can be reduced. Accordingly, the magnetic coupling device 30*i* has a high CMTI and a high noise-resistance amount, and can transmit a modulated signal (differential signal) and excellently operate under an environment with a high external magnetic field.

Figure 7:
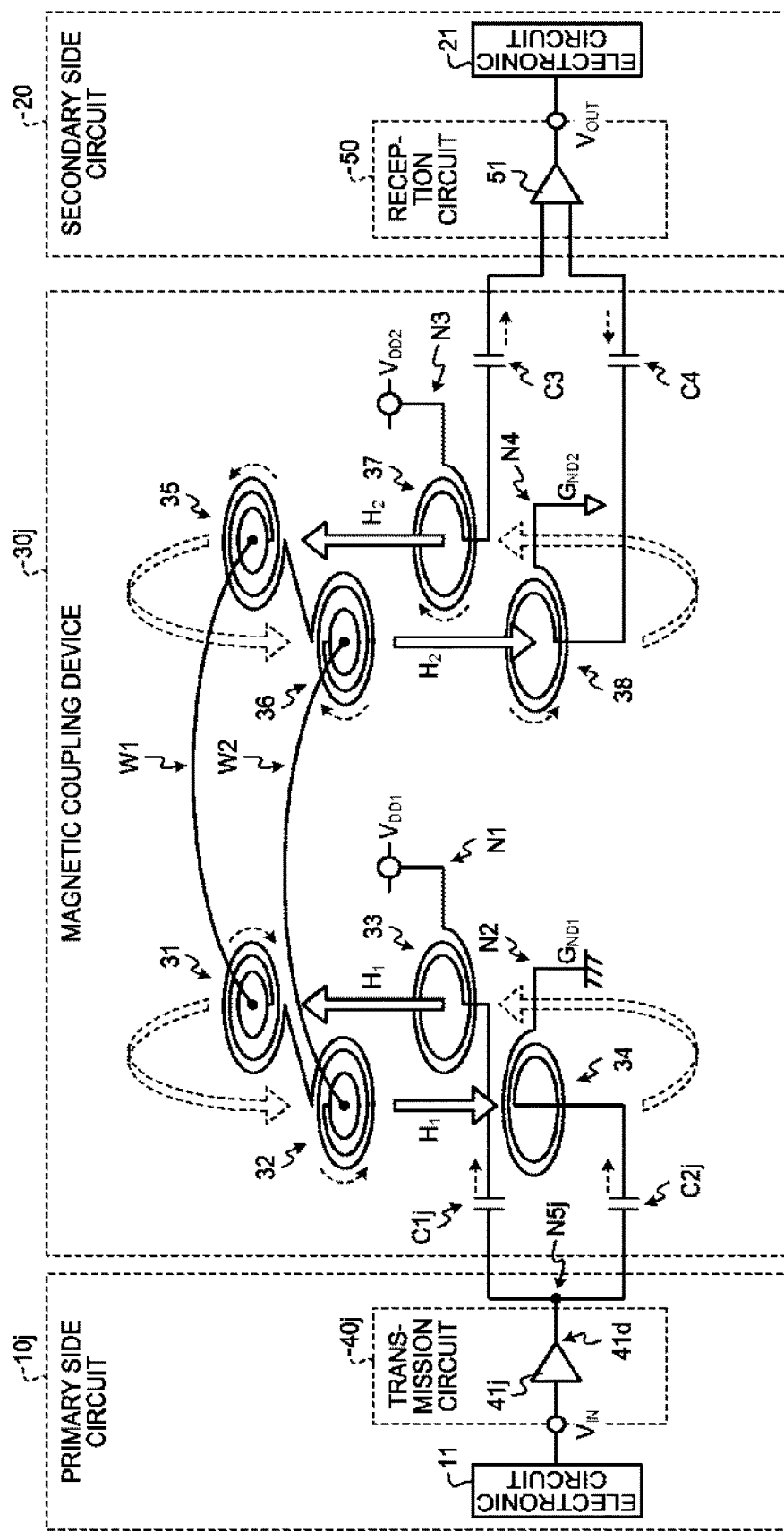
FIG. 7 is a diagram illustrating a circuit configuration and a signal transmitting operation of a communication system including a magnetic coupling device according to a second modification of the embodiment.

Alternatively, as a second modification of the embodiment, a communication system 1*j* may have a configuration as illustrated in FIG. 7. FIG. 7 is a diagram illustrating a circuit configuration and a signal transmitting operation of the communication system 1*j* including a magnetic coupling device 30*j* according to the second modification of the embodiment.

The communication system 1*j* illustrated in FIG. 7 includes a primary side circuit 10*j* and the magnetic coupling device 30*j* in place of the primary side circuit 10 and the magnetic coupling device 30 (refer to FIG. 1). The primary side circuit 10*j* includes a transmission circuit 40*j* in place of the transmission circuit 40 (refer to FIG. 1). The transmission circuit 40*j* includes a single-phase driver circuit 41*j* in place of the differential driver circuit 41 (refer to FIG. 1). The magnetic coupling device 30*j* includes a capacitor element C1*j* and a capacitor element C2*j* in place of the capacitor element C1 and the capacitor element C2 (refer to FIG. 1). The capacitor element C1*j* has one end electrically connected with the coils 33 and the other end electrically connected with an output terminal 41*d* of the single-phase driver circuit 41*j* through a node N5*j*. The capacitor element C2*j* has one end electrically connected with the coils 34 and the other end electrically connected with the output terminal 41*d* of the single-phase driver circuit 41*j* through the node N5*j*.

The signal transmitting operation is the same as the operation in the embodiment illustrated in FIG. 1, and the operation for the CMTI noise is the same as the operation in the embodiment illustrated in FIG. 3.

Figure 8:
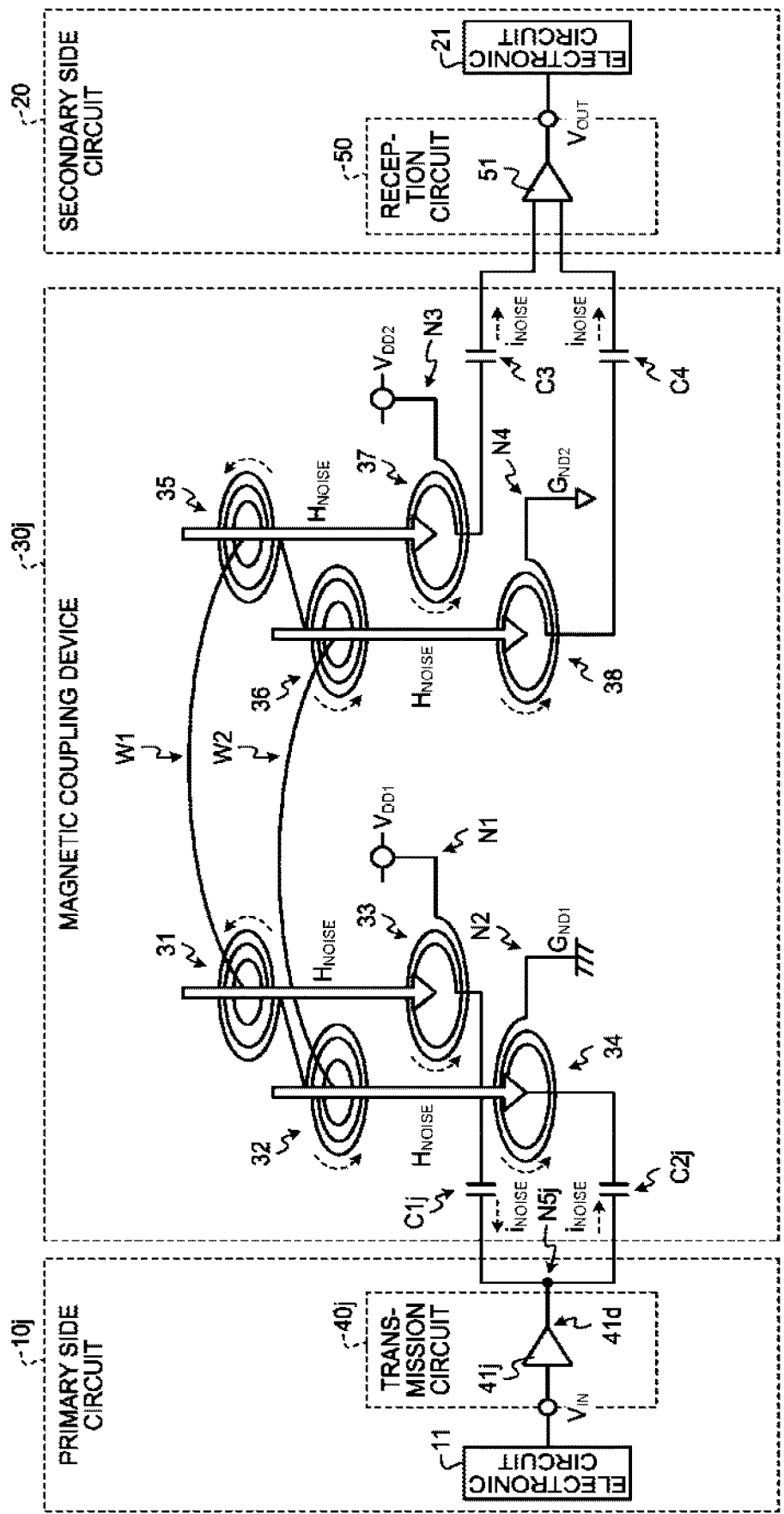
FIG. 8 is a diagram illustrating an operation for an external magnetic field by the communication system including the magnetic coupling device according to the second modification of the embodiment.

The operation for an external magnetic field is as illustrated in FIG. 8. FIG. 8 is a diagram illustrating the operation for an external magnetic field by the communication system 1*j* including the magnetic coupling device 30*j* according to the first modification of the embodiment. Specifically, when the external magnetic field $H_{NOISE}$ is applied as illustrated in FIG. 8, differential noise currents $I_{NOISE}$ flow to the single-phase driver circuit 41*j*. However, for example, the noise currents cancel each other at the node N5*j* on the output terminal 41*d* side of the single-phase driver circuit 41*j*, and the single-phase driver circuit 41*j* is not affected.

In this manner, in the second modification of the embodiment, too, the EMI noise can be reduced and the CMTI noise can be reduced. Accordingly, the magnetic coupling device 30*j* has a high CMTI and a high noise-resistance amount, and can transmit a modulated signal (differential signal) and excellently operate under an environment with a high external magnetic field.

Figure 9:
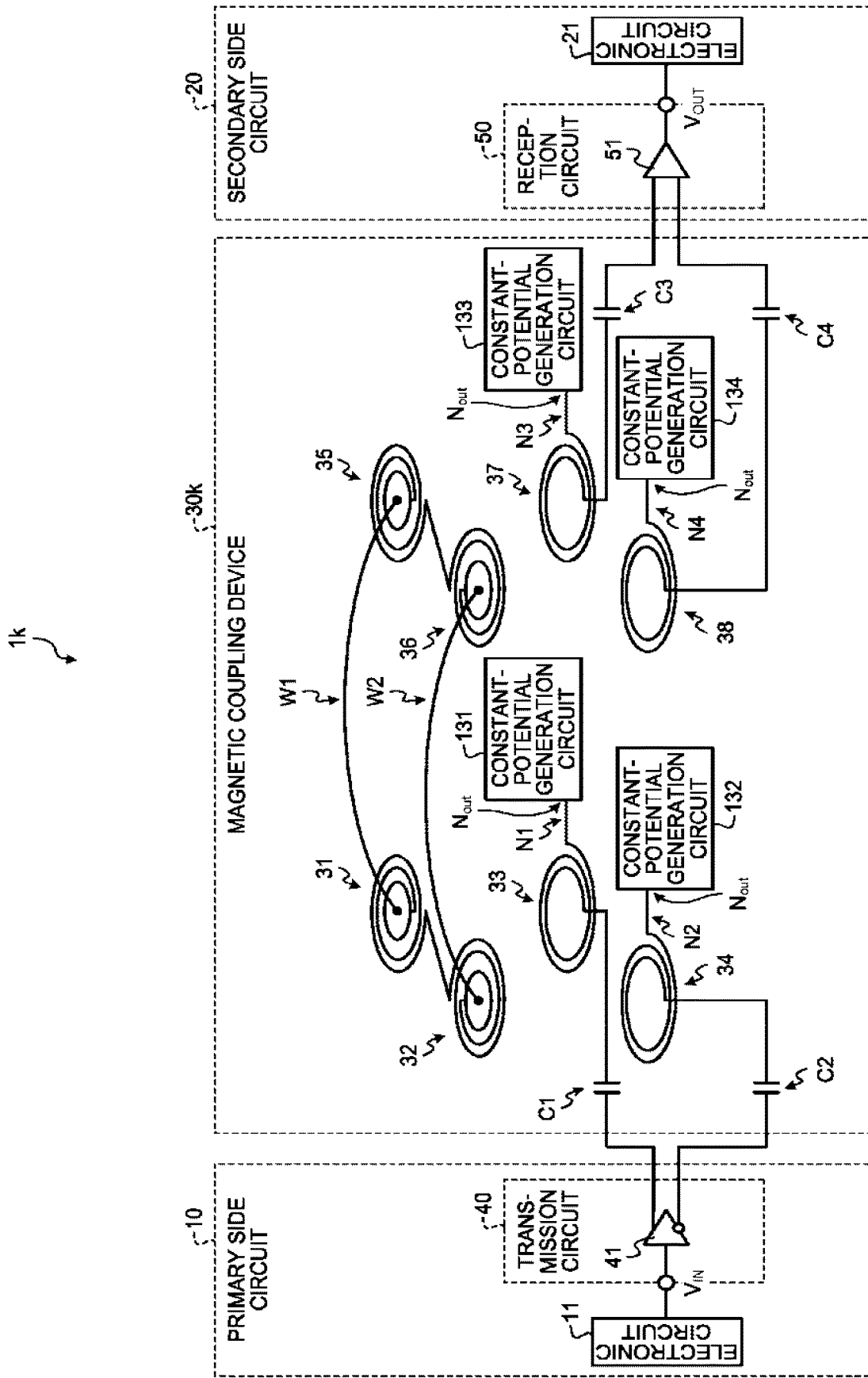
FIG. 9 is a diagram illustrating a circuit configuration of a communication system including a magnetic coupling device according to a third modification of the embodiment.

Alternatively, as a third modification of the embodiment, a communication system 1*k* may internally generate constant potentials as illustrated in FIG. 9. FIG. 9 is a diagram illustrating a circuit configuration of the communication system 1*k* including a magnetic coupling device 30*k* according to the third modification of the embodiment.

The communication system 1*k* illustrated in FIG. 9 includes a magnetic coupling device 30*k* in place of the magnetic coupling device 30 (refer to FIG. 1). The magnetic coupling device 30*k* further includes constant-potential generation circuits 131 to 134. The constant-potential generation circuits 131 to 134 are circuits configured to internally generate constant potentials in the chip regions 102 and 105. Output nodes Nout of the constant-potential generation circuits 131, 132, 133, and 134 are electrically connected with the nodes N1, N2, N3, and N4, respectively. Accordingly, the nodes N1, N2, N3, and N4 are supplied with internal constant potentials from the constant-potential generation circuits 131, 132, 133, and 134, respectively.

For example, when the constant potentials supplied to the nodes N1, N2, N3, and N4 are constant potentials outside of the chip regions 102 and 105, the constant potentials being different between the nodes N1 and N2 and between the nodes N3 and N4, each constant potential is supplied on a path in a large loop including a bonding wire, a lead frame, and a PCB substrate pattern, and thus potentially easily affected by an external magnetic field. The influence of the external magnetic field can be reduced by supplying, to the nodes N1, N2, N3, and N4, internal constant potentials generated from in-chip constant potentials supplied from the constant-potential generation circuits 131 to 134 as illustrated in FIG. 9.

Figure 10A:
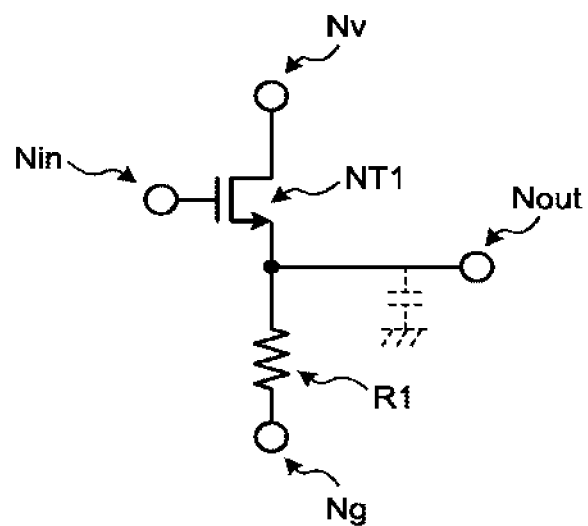
FIGS. 10A, 10B, and 10C are each a diagram illustrating a circuit configuration of a constant-potential generation circuit according to the third modification of the embodiment.
Figure 10B:
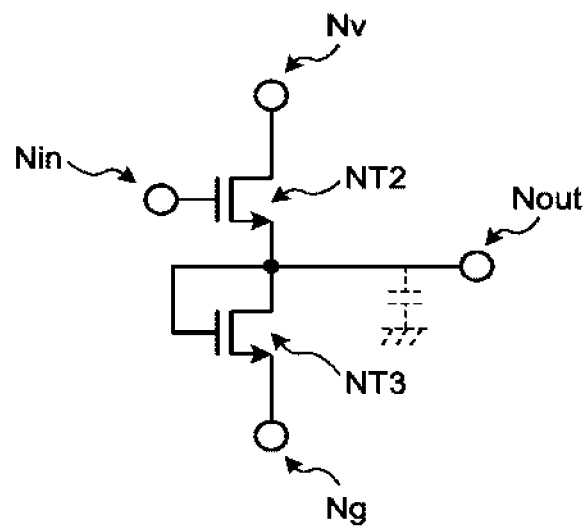
Figure 10C:
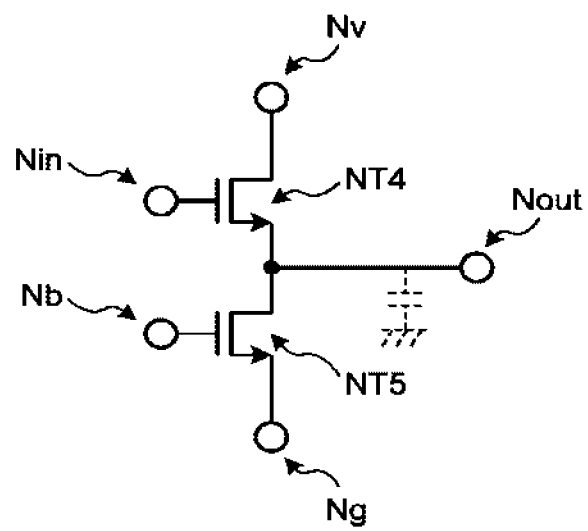

The constant-potential generation circuits 131 to 134 may be configured as source follower circuits as illustrated in FIGS. 10A, 10B, and 10C. FIGS. 10A, 10B, and 10C are diagrams illustrating circuit configurations of the respective constant-potential generation circuits in the third modification of the embodiment.

For example the constant-potential generation circuits 131 to 134 each include an NMOS transistor NT1 and a resistance element R1 as illustrated in FIG. 10A. The NMOS transistor NT1 has a gate electrically connected with an input node Nin, a drain electrically connected with a power source node Nv, and a source electrically connected with an output node Nout and one end of the resistance element R1. The resistance element R1 has one end electrically connected with the source of the NMOS transistor NT1 and the output node Nout, and the other end electrically connected with a ground node Ng. The input node Nin may be supplied with, for example, an internal power potential from a regulator circuit (not illustrated) in the chip regions 102 and 105. The power source node Nv may be supplied with a power potential (for example, the power potential $V_{DD1}$ or the power potential $V_{DD2}$) from the outside of the chip regions 102 and 105. The ground node Ng may be supplied with a ground potential (for example, the ground potential $G_{ND1}$ or the ground potential $G_{ND2}$) from the outside of the chip regions 102 and 105. To reduce AC output impedance, a capacitor element may be provided to the output node Nout as illustrated with dashed lines. With the source follower circuit configured as illustrated in FIG. 10A, a constant potential is output from the output node Nout.

Alternatively, the constant-potential generation circuits 131 to 134 each include an NMOS transistor NT2 and an NMOS transistor NT3 as illustrated in FIG. 10B. The NMOS transistor NT2 has a gate electrically connected with the input node Nin, a drain electrically connected with the power source node Nv, and a source electrically connected with an output node Nout and the source of the NMOS transistor NT3. The NMOS transistor NT3 has a gate and a drain electrically connected with the source of the NMOS transistor NT2 and the output node Nout, and a source electrically connected with the ground node Ng. Potentials supplied to the nodes Nin, Nv, and Ng the same as those in the case of FIG. 10A. To reduce AC output impedance, a capacitor element may be provided to the output node Nout as illustrated with dashed lines. With the source follower circuit configured as illustrated in FIG. 10B, a constant potential is output from the output node Nout.

Alternatively, as illustrated in FIG. 10C, the constant-potential generation circuits 131 to 134 includes an NMOS transistor NT4 and an NMOS transistor NT5. The NMOS transistor NT4 has a gate electrically connected with the input node Nin, a drain electrically connected with the power source node Nv, and the source electrically connected with an output node Nout and the source of the NMOS transistor NT5. The NMOS transistor NT5 has a gate electrically connected with a bias node Nb, a drain electrically connected with the source of the NMOS transistor NT4 and the output node Nout, and a source electrically connected with the ground node Ng. Potentials supplied to the nodes Nin, Nv, and Ng are the same as those in the case of FIG. 10A. The bias node Nb may be supplied with, for example, a bias potential from a regulator circuit (not illustrated) in the chip regions 102 and 105. To reduce AC output impedance, a capacitor element may be provided to the output node Nout as illustrated with dashed lines. With the source follower circuit configured as illustrated in FIG. 10C, a constant potential is output from the output node Nout.

In this manner, in the third modification of the embodiment, influence of an external magnetic field on constant potentials supplied to the nodes N1 to N4 can be reduced to stabilize supply of the constant potentials to the nodes N1 to N4.

Figure 11:
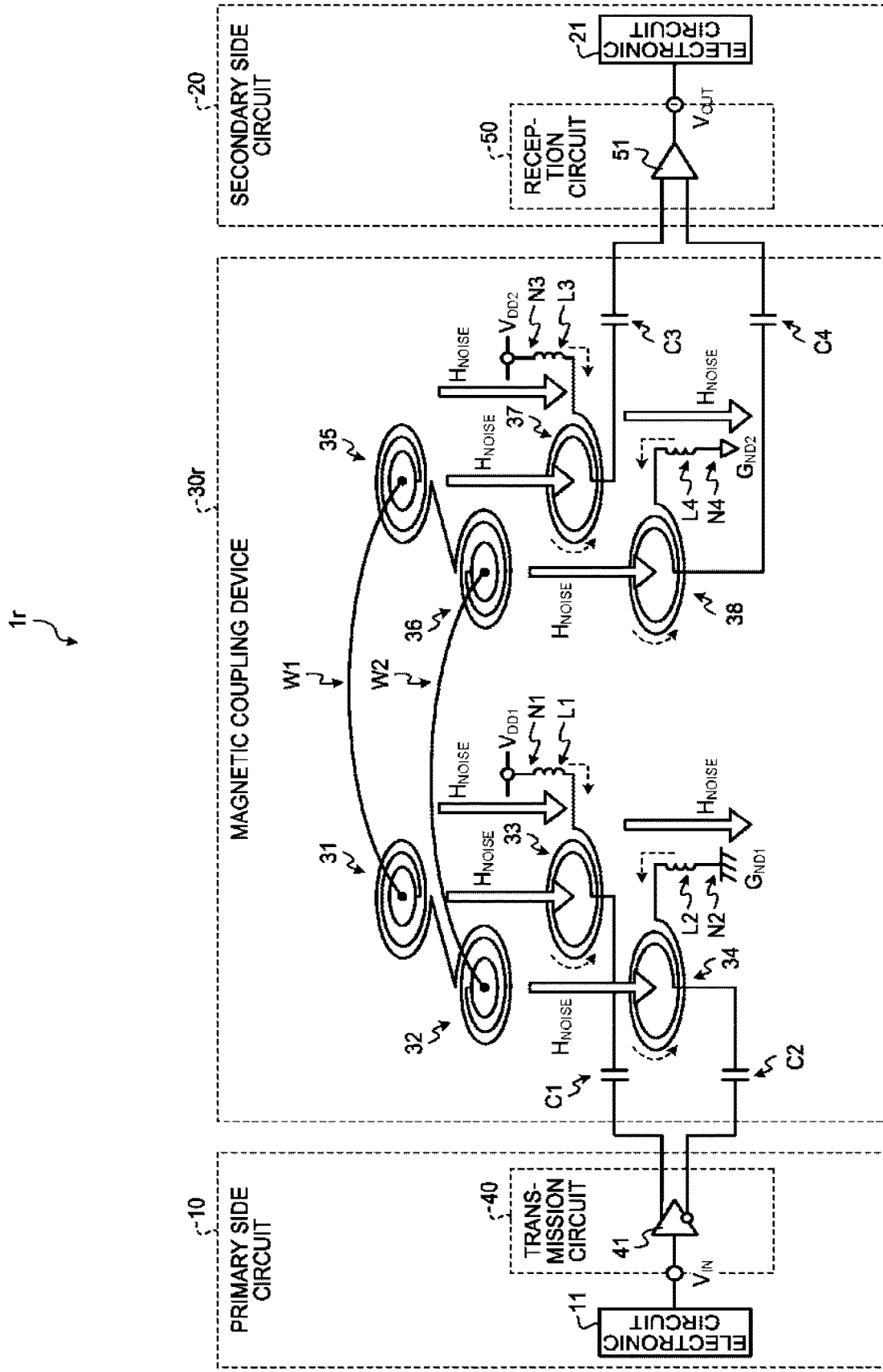
FIG. 11 is a diagram illustrating a circuit configuration of a communication system including a magnetic coupling device according to a fourth modification of the embodiment and an operation for an external magnetic field by the communication system.

Alternatively, as a fourth modification of the embodiment, a communication system 1r may have a configuration as illustrated in FIG. 11. FIG. 11 is a diagram illustrating a circuit configuration and a signal transmitting operation of the communication system 1r including a magnetic coupling device 30r according to the fourth modification of the embodiment.

The communication system 1r illustrated in FIG. 11 includes the magnetic coupling device 30r in place of the magnetic coupling device 30 (refer to FIG. 1). The magnetic coupling device 30r further includes inductors L1 to L4.

The inductor L1 is disposed between the coil 33 and the node N1. The inductor L1 has one end electrically connected with the coils 33, and the other end electrically connected with the node N1. The inductor L1 is disposed with the central axis thereof aligned with the direction perpendicular to the surface of the substrate 2 (the Z direction illustrated in FIG. 2), and is wound in a direction opposite to a direction in which the coil 33 is wound.

The inductor L2 is disposed between the coil 34 and the node N2. The inductor L2 has one end electrically connected with the coils 34, and the other end electrically connected with the node N2. The inductor L2 is disposed with the central axis thereof aligned with the direction perpendicular to the surface of the substrate 2 (the Z direction illustrated in FIG. 2), and is wound in a direction opposite to a direction in which the coil 34 is wound.

The inductor L3 is disposed between the coil 37 and the node N3. The inductor L3 has one end electrically connected with the coils 37, and the other end electrically connected with the node N3. The inductor L1 is disposed with the central axis thereof aligned with the direction perpendicular to the surface of the substrate 5 (the Z direction illustrated in FIG. 2), and is wound in a direction opposite to a direction in which the coil 37 is wound.

The inductor L4 is disposed between the coil 38 and the node N4. The inductor L4 has one end electrically connected with the coils 38, and the other end electrically connected with the node N4. The inductor L4 is disposed with the central axis thereof aligned with the direction perpendicular to the surface of the substrate 5 (the Z direction illustrated in FIG. 2), and is wound in a direction opposite to a direction in which the coil 38 is wound.

The operation for an external magnetic field is as illustrated in FIG. 11. Specifically, when the external magnetic field $H_{NOISE}$ is applied as illustrated in FIG. 11, induced voltages of the coil 33 and the inductor L1 due to the external magnetic field $H_{NOISE}$ are opposite to each other as indicated by a dashed-line arrow. Accordingly, voltage change occurring to the capacitor element C1 due to the external magnetic field $H_{NOISE}$ can be reduced, and thus the noise currents $I_{NOISE}$ flowing to the differential driver circuit 41 can be reduced.

When the external magnetic field $H_{NOISE}$ is applied as illustrated in FIG. 11, induced voltages of the coil 34 and the inductor L2 due to the external magnetic field $H_{NOISE}$ are opposite to each other as indicated by a dashed-line arrow. Accordingly, voltage change occurring to the capacitor element C2 due to the external magnetic field $H_{NOISE}$ can be reduced, and thus the noise currents $I_{NOISE}$ flowing to the differential driver circuit 41 can be reduced.

When the external magnetic field $H_{NOISE}$ is applied as illustrated in FIG. 11, induced voltages of the coil 37 and the inductor L3 due to the external magnetic field $H_{NOISE}$ are opposite to each other as indicated by a dashed-line arrow. Accordingly, voltage change occurring to the capacitor element C3 due to the external magnetic field $H_{NOISE}$ can be reduced, and thus the noise currents $I_{NOISE}$ flowing to the differential receiver circuit 51 can be reduced.

When the external magnetic field $H_{NOISE}$ is applied as illustrated in FIG. 11, induced voltages of the coil 38 and the inductor L4 due to the external magnetic field $H_{NOISE}$ are opposite to each other as indicated by a dashed-line arrow. Accordingly, voltage change occurring to the capacitor element C4 due to the external magnetic field $H_{NOISE}$ can be reduced, and thus the noise currents $I_{NOISE}$ flowing to the differential receiver circuit 51 can be reduced.

In this manner, in the fourth modification of the embodiment, resistance against the external magnetic field $H_{NOISE}$ can be improved by using the inductors L1 to L4. The area of each inductor when viewed from above may be smaller than that of the corresponding coil, and the thickness of each insulating film may be reduced. Moreover, each inductor and the corresponding coil may be stacked on each other in the Z direction. With any of these configurations, the same effects as the above-described effects are acquired.

(Note 1)
A magnetic coupling device comprising:
a first coil;
a second coil electrically connected with one end of the first coil and wound in a direction opposite to a direction in which the first coil is wound;
a third coil facing the first coil;
a fourth coil facing the second coil;
a first constant-potential node electrically connected with one end of the third coil; and a second constant-potential node electrically connected with one end of the fourth coil.

(Note 2)
The magnetic coupling device according to Note 1, further comprising:
a fifth coil electrically connected with the other end of the first coil;
a sixth coil electrically connected with the other end of the second coil and one end of the fifth coil and wound in a direction opposite to a direction in which the fifth coil is wound;
a seventh coil facing the fifth coil;
an eighth coil facing the sixth coil;
a third constant-potential node electrically connected with one end of the seventh coil; and
a fourth constant-potential node electrically connected with one end of the eighth coil.

(Note 3)
The magnetic coupling device according to Note 1, further comprising:
a first capacitor element electrically connected between a first circuit and the other end of the third coil; and
a second capacitor element electrically connected between the first circuit and the other end of the fourth coil.

(Note 4)
The magnetic coupling device according to Note 2, further comprising:
a first capacitor element electrically connected between a first circuit and the other end of the third coil;
a second capacitor element electrically connected between the first circuit and the other end of the fourth coil;
a third capacitor element electrically connected between a second circuit and the other end of the seventh coil; and
a fourth capacitor element electrically connected between the second circuit and the other end of the eighth coil.

(Note 5)
The magnetic coupling device according to Note 1 or 3, wherein the first constant-potential node and the second constant-potential node have potentials different from each other.

(Note 6)
The magnetic coupling device according to Note 2 or 4, wherein
the first constant-potential node and the second constant-potential node have potentials different from each other, and
the third constant-potential node and the fourth constant-potential node have potentials different from each other.

(Note 7)
The magnetic coupling device according to Note 1 or 3, wherein the first constant-potential node and the second constant-potential node have potentials equal to each other.

(Note 8)
The magnetic coupling device according to Note 2 or 4, wherein
the first constant-potential node and the second constant-potential node have potentials equal to each other, and
the third constant-potential node and the fourth constant-potential node have potentials equal to each other.

(Note 9)
The magnetic coupling device according to Note 1 or 3, further comprising:
a first constant-potential generation circuit electrically connected with the first constant-potential node; and
a second constant-potential generation circuit electrically connected with the second constant-potential node, wherein
a reference potential of the first constant-potential generation circuit and a reference potential of the second constant-potential generation circuit are common to each other.

(Note 10)
The magnetic coupling device according to Note 2 or 4, further comprising:
a first constant-potential generation circuit electrically connected with the first constant-potential node;
a second constant-potential generation circuit electrically connected with the second constant-potential node,
a third constant-potential generation circuit electrically connected with the third constant-potential node; and
a fourth constant-potential generation circuit electrically connected with the fourth constant-potential node, wherein
a reference potential of the first constant-potential generation circuit and a reference potential of the second constant-potential generation circuit are common to each other, and a reference potential of the third constant-potential generation circuit and a reference potential of the fourth constant-potential generation circuit are common to each other.

(Note 11)

The magnetic coupling device according to Note 1 or 3, further comprising:
a first inductor electrically connected between the one end of the third coil and the first constant-potential node; and
a second inductor electrically connected between the one end of the fourth coil and the second constant-potential node.

(Note 12)

The magnetic coupling device according to Note 2 or 4, further comprising:
a first inductor electrically connected between the one end of the third coil and the first constant-potential node;
a second inductor electrically connected between the one end of the fourth coil and the second constant-potential node;
a third inductor electrically connected between one end of the seventh coil and the third constant-potential node; and
a fourth inductor electrically connected between one end of the eighth coil and the fourth constant-potential node.

(Note 13)

The magnetic coupling device according to Note 3, wherein
the first circuit has a differential configuration, and
the third coil and the fourth coil are wound in directions identical to each other.

(Note 14)

The magnetic coupling device according to Note 3, wherein
the first circuit has an in-phase configuration, and
the third coil and the fourth coil are wound in directions opposite to each other.

(Note 15)

The magnetic coupling device according to Note 3, wherein
the first circuit has a single-phase configuration, and
the third coil and the fourth coil are wound in directions opposite to each other.

(Note 16)

The magnetic coupling device according to Note 4, wherein
the first circuit has a differential configuration,
the second circuit has a differential configuration,
the third coil and the fourth coil are wound in directions identical to each other, and
the seventh coil and the eighth coil are wound in directions identical to each other.

(Note 17)

The magnetic coupling device according to Note 4, wherein
the first circuit has an in-phase configuration,
the second circuit has a differential configuration,
the third coil and the fourth coil are wound in directions opposite to each other, and
the seventh coil and the eighth coil are wound in directions identical to each other.

(Note 18)

The magnetic coupling device according to Note 4, wherein
the first circuit has a single-phase configuration,
the second circuit has a differential configuration,
the third coil and the fourth coil are wound in directions opposite to each other, and
the seventh coil and the eighth coil are wound in directions identical to each other.

(Note 19)

The magnetic coupling device according to Note 3, wherein the first circuit is a transmission circuit.

(Note 20)

A communication system comprising:
a transmission circuit;
a reception circuit; and the magnetic coupling device according to any one of Notes 1 to 19 disposed between the transmission circuit and the reception circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic coupling device comprising:
a first coil;
a second coil electrically connected with the first coil at each most outer point, the second coil being arranged substantially on a same plane as the first coil, the first coil and the second coil forming an 8-shaped coil, the first coil being wound from a most inner point to the most outer point along a first rotation direction, the second coil being wound from the most outer point to a most inner point along a second rotation direction when seen from a direction perpendicular to the plane, the second rotation direction being opposite to the first rotation direction;
a third coil facing the first coil;
a fourth coil facing the second coil;
a first constant-potential node electrically connected with a first end of the third coil; and
a second constant-potential node electrically connected with a first end of the fourth coil.

2. The magnetic coupling device according to claim 1, wherein
the third coil is wound from a most inner point to a most outer point along the first rotation direction when seen from the direction perpendicular to the plane, and
the fourth coil is wound from a most inner point to a most outer point along the first rotation direction when seen from the direction perpendicular to the plane.

3. The magnetic coupling device according to claim 1, wherein
the third coil is wound from a most inner point to a most outer point along the first rotation direction when seen from the direction perpendicular to the plane, and
the fourth coil is wound from a most inner point to a most outer point along a third rotation direction when seen from the direction perpendicular to the plane, the third rotation direction being opposite to the first rotation direction.

4. The magnetic coupling device according to claim 1, further comprising:
a pair of a first input node and a second input node;
a first capacitor element electrically connected between the first input node and a second end of the third coil; and a second capacitor element electrically connected between the second input node and a second end of the fourth coil.

5. The magnetic coupling device according to claim 1, further comprising:
a pair of a first output node and a second output node;
a first capacitor element electrically connected between the first output node and a second end of the third coil; and
a second capacitor element electrically connected between the second output node and a second end of the fourth coil.

6. The magnetic coupling device according to claim 1, wherein
the first constant-potential node and the second constant-potential node have potentials equal to each other.

7. The magnetic coupling device according to claim 1, wherein
the first constant-potential node and the second constant-potential node have potentials different from each other.

8. The magnetic coupling device according to claim 2, further comprising:
a pair of a first input node and a second input node;
a first capacitor element electrically connected between the first input node and a second end of the third coil; and
a second capacitor element electrically connected between the second input node and a second end of the fourth coil.

9. The magnetic coupling device according to claim 2, further comprising:
a pair of a first output node and a second output node;
a first capacitor element electrically connected between the first output node and a second end of the third coil; and
a second capacitor element electrically connected between the second output node and a second end of the fourth coil.

10. The magnetic coupling device according to claim 2, wherein
the first constant-potential node and the second constant-potential node have potentials equal to each other.

11. The magnetic coupling device according to claim 2, wherein
the first constant-potential node and the second constant-potential node have potentials different from each other.

12. The magnetic coupling device according to claim 3, further comprising:
a pair of a first input node and a second input node;
a first capacitor element electrically connected between the first input node and a second end of the third coil; and
a second capacitor element electrically connected between the second input node and a second end of the fourth coil.

13. The magnetic coupling device according to claim 3, wherein
the first constant-potential node and the second constant-potential node have potentials equal to each other.

14. The magnetic coupling device according to claim 3, wherein
the first constant-potential node and the second constant-potential node have potentials different from each other.

15. A communication system comprising:
a transmission circuit; and
the magnetic coupling device according to claim 4,
wherein the first input node and the second input node are electrically connected to the transmission circuit.

16. A communication system comprising:
a transmission circuit; and
the magnetic coupling device according to claim 8,
wherein the first input node and the second input node are electrically connected to the transmission circuit, and
the transmission circuit is a differential driver circuit to transmit differential signals to the first input node and the second input node.

17. A communication system comprising:
a transmission circuit; and
the magnetic coupling device according to claim 12,
wherein the first input node and the second input node are electrically connected to the transmission circuit, and
the transmission circuit is an in-phase driver circuit or a single-phase driver circuit to transmit in-phase signals or single-phase signals to the first input node and the second input node.

18. A communication system comprising:
a reception circuit; and
the magnetic coupling device according to claim 5,
wherein the first output node and the second output node are electrically connected to the reception circuit.

19. A communication system comprising:
a reception circuit; and
the magnetic coupling device according to claim 9,
wherein the first output node and the second output node are electrically connected to the reception circuit, and
the reception circuit is a differential receiver circuit to receive differential signals from the first output node and the second output node.

20. A communication system comprising:
a transmission circuit;
a reception circuit; and
the magnetic coupling device according to claim 1 electrically connected between the transmission circuit and the reception circuit.

* * * * *